United States Patent
Kim et al.

(10) Patent No.: US 12,248,014 B2
(45) Date of Patent: Mar. 11, 2025

(54) INSULATION MONITORING DEVICE USING TRIANGULAR WAVE AND METHOD FOR CONTROLLING THEREOF

(71) Applicants: DONGWOO ELECTRIC CORP., Pyeongtaek-si (KR); CHUNGBUK NATIONAL UNIVERSITY INDUSTRY-ACADEMIC COOPERATION FOUNDATION, Cheongju-si (KR)

(72) Inventors: Sun Woo Kim, Hwaseong-si (KR); Jong-Phil Hong, Sejong-si (KR)

(73) Assignees: DONGWOO ELECTRIC CORP. & CHUNGBUK NATIONAL, Pyeongtaek (KR); UNIVERSITY INDUSTRY-ACADEMIC COOPERATION FOUNDATION, Cheongju-si (KR)

(*) Notice: Subject to any disclaimer, the term of this patent is extended or adjusted under 35 U.S.C. 154(b) by 140 days.

(21) Appl. No.: 18/018,100

(22) PCT Filed: Sep. 7, 2020

(86) PCT No.: PCT/KR2020/012047
§ 371 (c)(1),
(2) Date: Jan. 26, 2023

(87) PCT Pub. No.: WO2022/025338
PCT Pub. Date: Feb. 3, 2022

(65) Prior Publication Data
US 2023/0280389 A1    Sep. 7, 2023

(30) Foreign Application Priority Data
Jul. 28, 2020    (KR) .......... 10-2020-0093990

(51) Int. Cl.
*G01R 31/14*    (2006.01)
*G01R 13/02*    (2006.01)
(Continued)

(52) U.S. Cl.
CPC ............. *G01R 31/14* (2013.01); *G01R 13/02* (2013.01); *G01R 19/0023* (2013.01);
(Continued)

(58) Field of Classification Search
CPC .... G01R 31/14; G01R 13/02; G01R 19/0023; G01R 19/0053; G01R 19/252;
(Continued)

(56) References Cited

U.S. PATENT DOCUMENTS

2016/0315461 A1* 10/2016 Pieler ................. H02H 3/16
2016/0377670 A1* 12/2016 Tamida ............... G01R 31/52
                                                           324/551
(Continued)

FOREIGN PATENT DOCUMENTS

JP          S62209371 A    9/1987
KR    1020060027163 A    3/2006
(Continued)

OTHER PUBLICATIONS

International Search Report and Written Opinion of PCT Appl. No. PCT/KR2020/012047 mail date Apr. 22, 2021, 8 pages.

Primary Examiner — Jermele M Hollington
Assistant Examiner — Zannatul Ferdous
(74) Attorney, Agent, or Firm — Maine Cernota & Curran

(57) ABSTRACT

An insulation monitoring device, according to various embodiment of the present application, comprising an impedance formed between a power line and a ground of a system comprises, a signal generation circuit for applying a triangular wave signal to the power line through a signal measurement circuit, the signal measurement circuit for
(Continued)

measuring a voltage difference across the detection resistor of the signal measurement circuit or a current flowing through the detection resistor when the triangular wave signal is applied to the impedance, a control circuit for obtaining an impedance value of the impedance based on at least one of the voltage difference and the current, and monitoring the impedance value.

14 Claims, 8 Drawing Sheets

(51) Int. Cl.
    *G01R 19/00*     (2006.01)
    *G01R 19/252*     (2006.01)
    *G01R 27/16*     (2006.01)

(52) U.S. Cl.
    CPC ....... *G01R 19/0053* (2013.01); *G01R 19/252* (2013.01); *G01R 27/16* (2013.01)

(58) Field of Classification Search
    CPC ...... G01R 27/16; G01R 31/085; G01R 31/52; G01R 13/0281; G01R 27/025; G01R 27/08; G01R 27/20; G01R 27/2605; G01R 29/26
    See application file for complete search history.

(56) References Cited

U.S. PATENT DOCUMENTS

| | | |
|---|---|---|
| 2017/0328940 A1 | 11/2017 | Choi |
| 2020/0081072 A1* | 3/2020 | Hackl .................... G01R 31/42 |
| 2020/0091569 A1* | 3/2020 | Sauerteig .............. H01M 10/48 |
| 2021/0063464 A1* | 3/2021 | Xie ........................ H02M 7/219 |

FOREIGN PATENT DOCUMENTS

| | | |
|---|---|---|
| KR | 1020090105773 A | 10/2009 |
| KR | 101407864 B1 | 6/2014 |
| KR | 1020190030831 A | 3/2019 |

* cited by examiner

[Fig. 1]
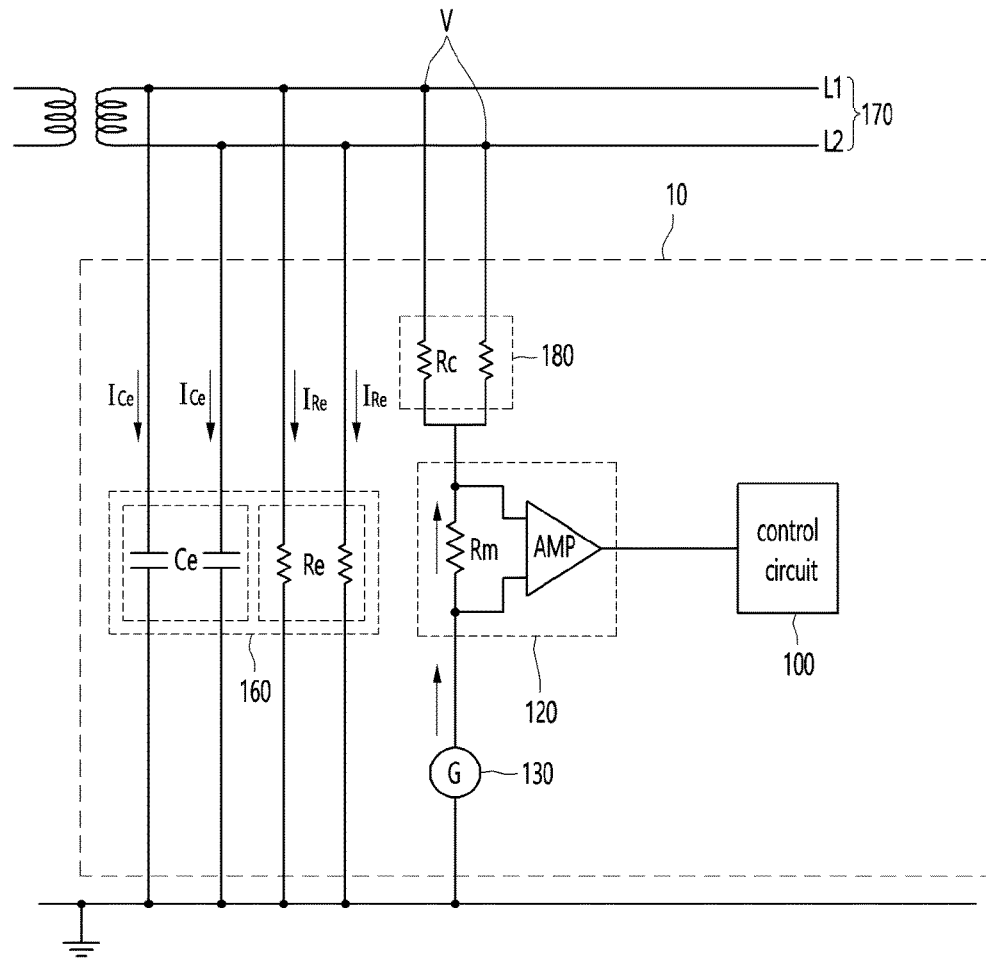
[Fig. 2]
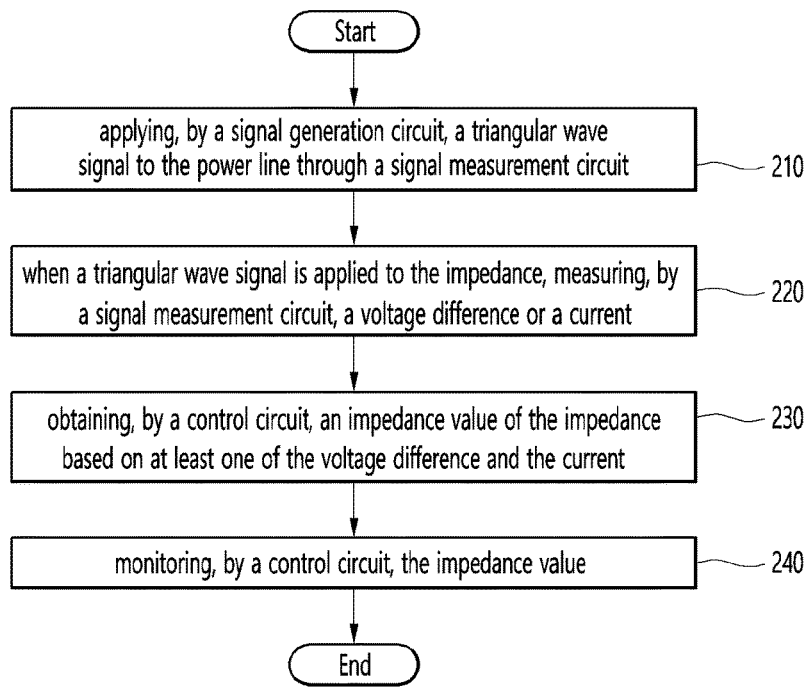

[Fig. 3]
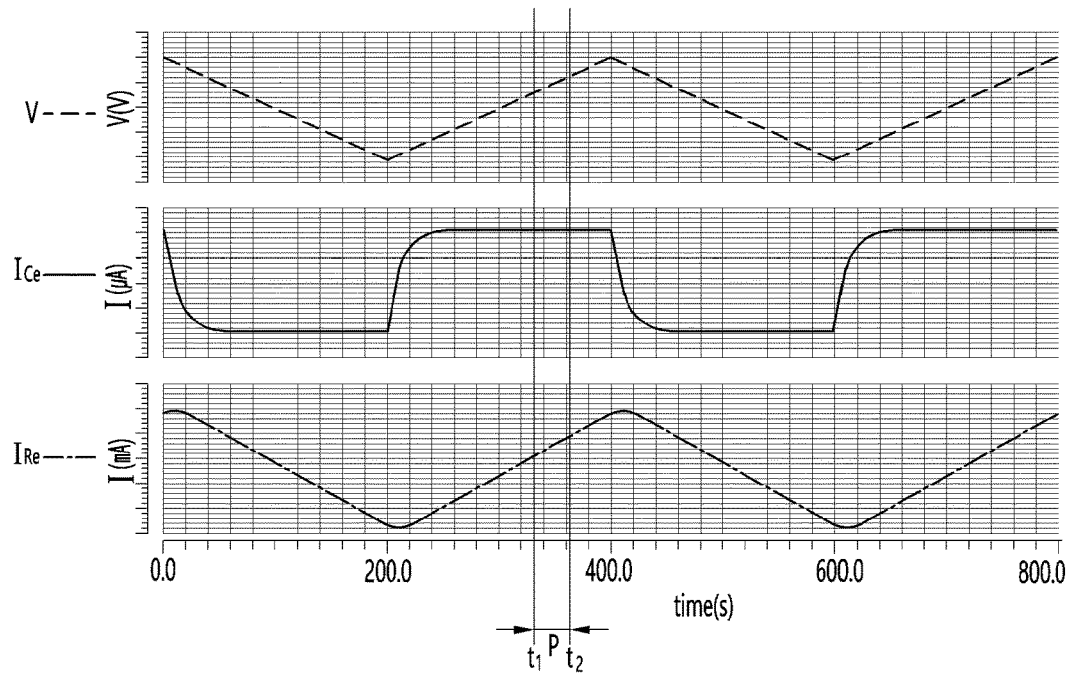
[Fig. 4]
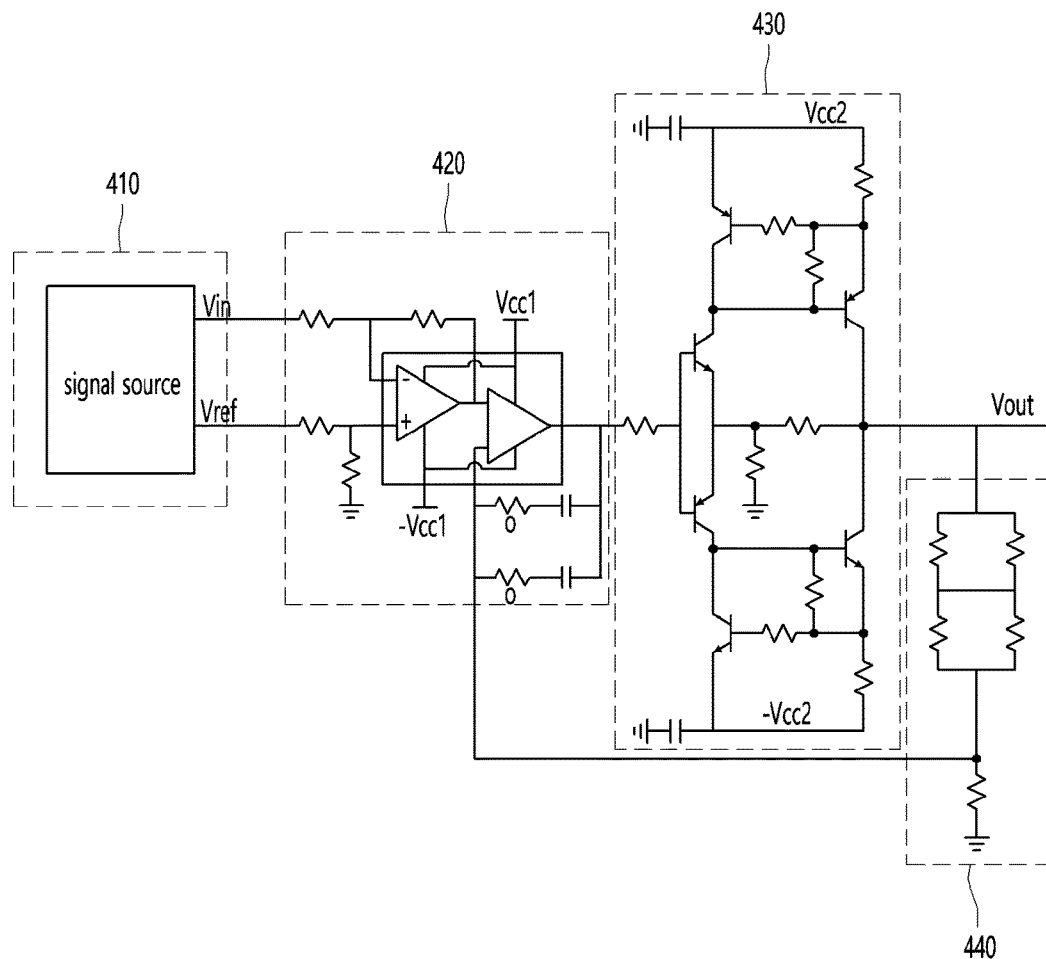

[Fig. 5]
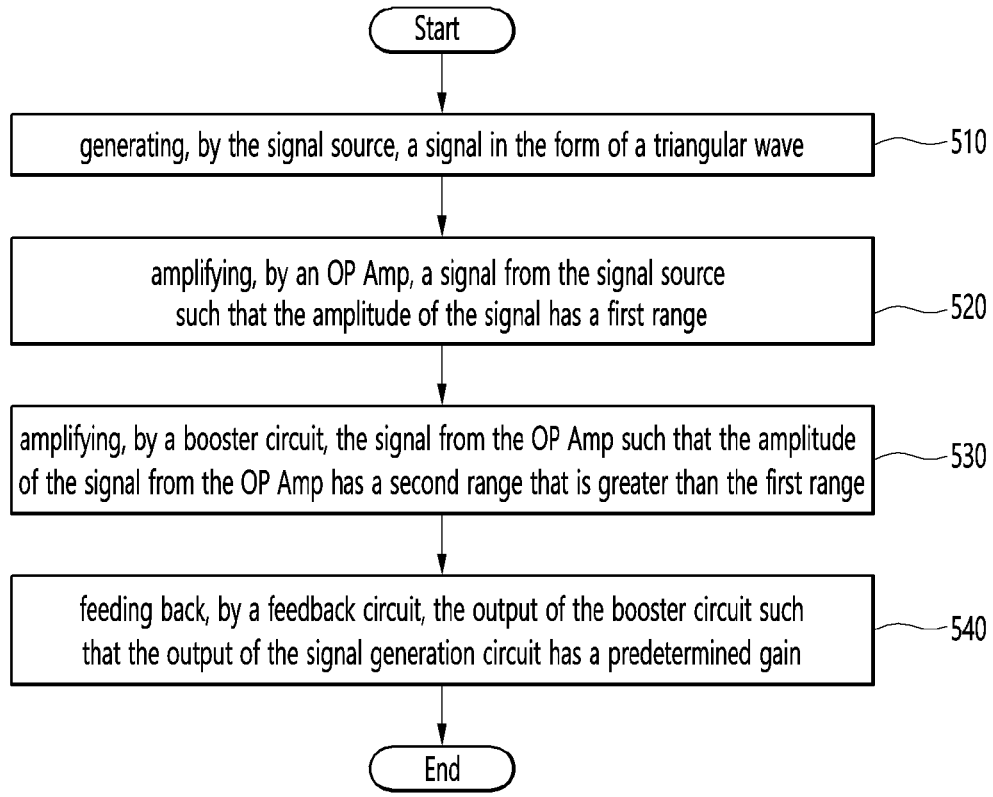
[Fig. 6]
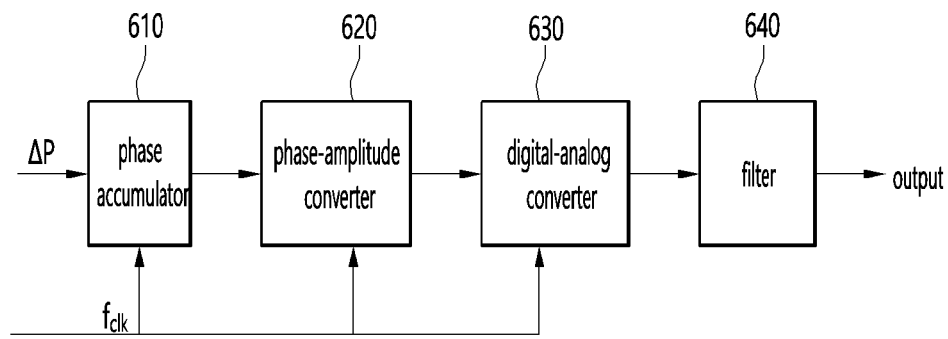

[Fig. 7]
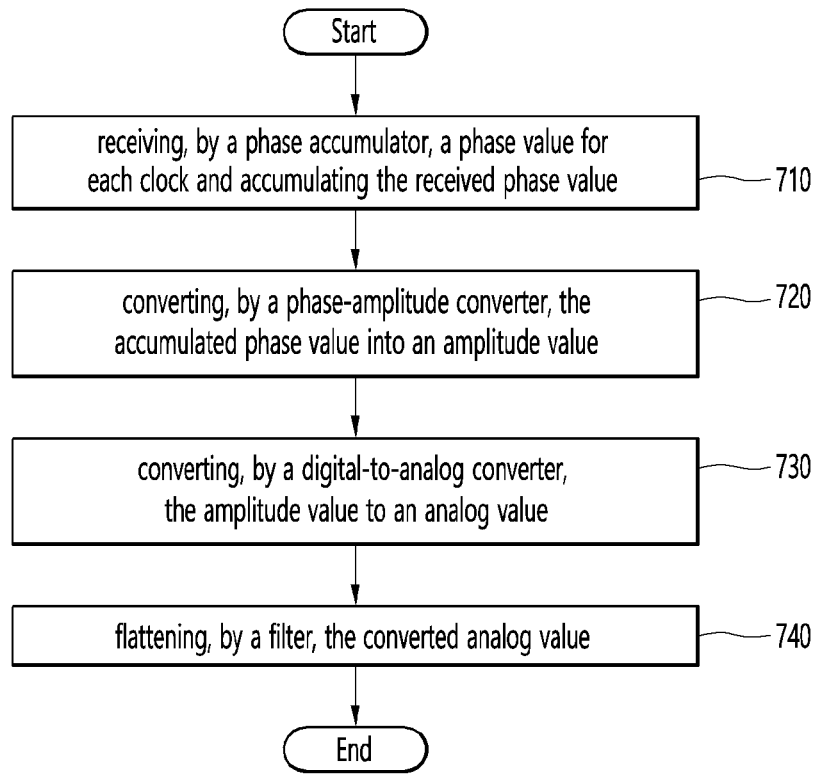
[Fig. 8]
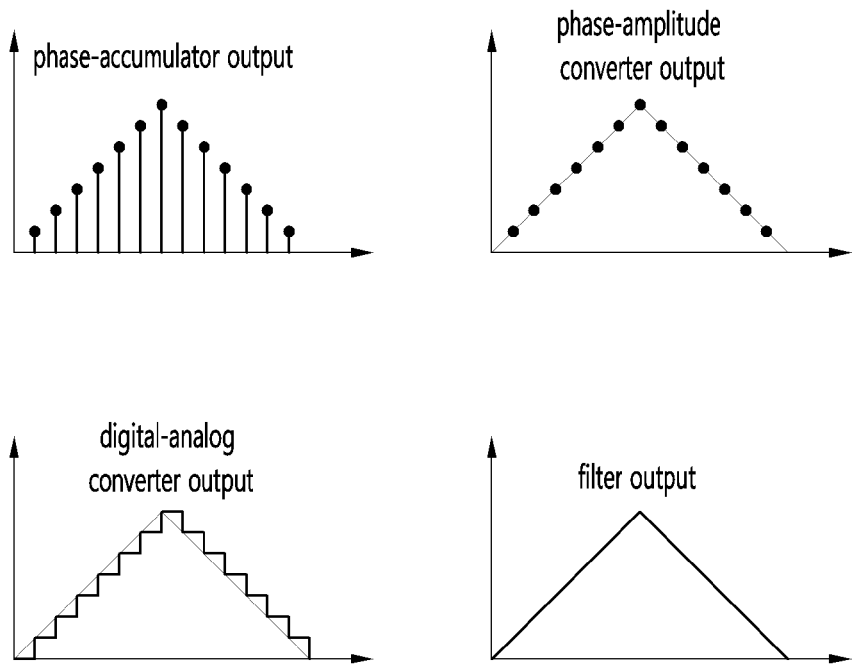

[Fig. 9]
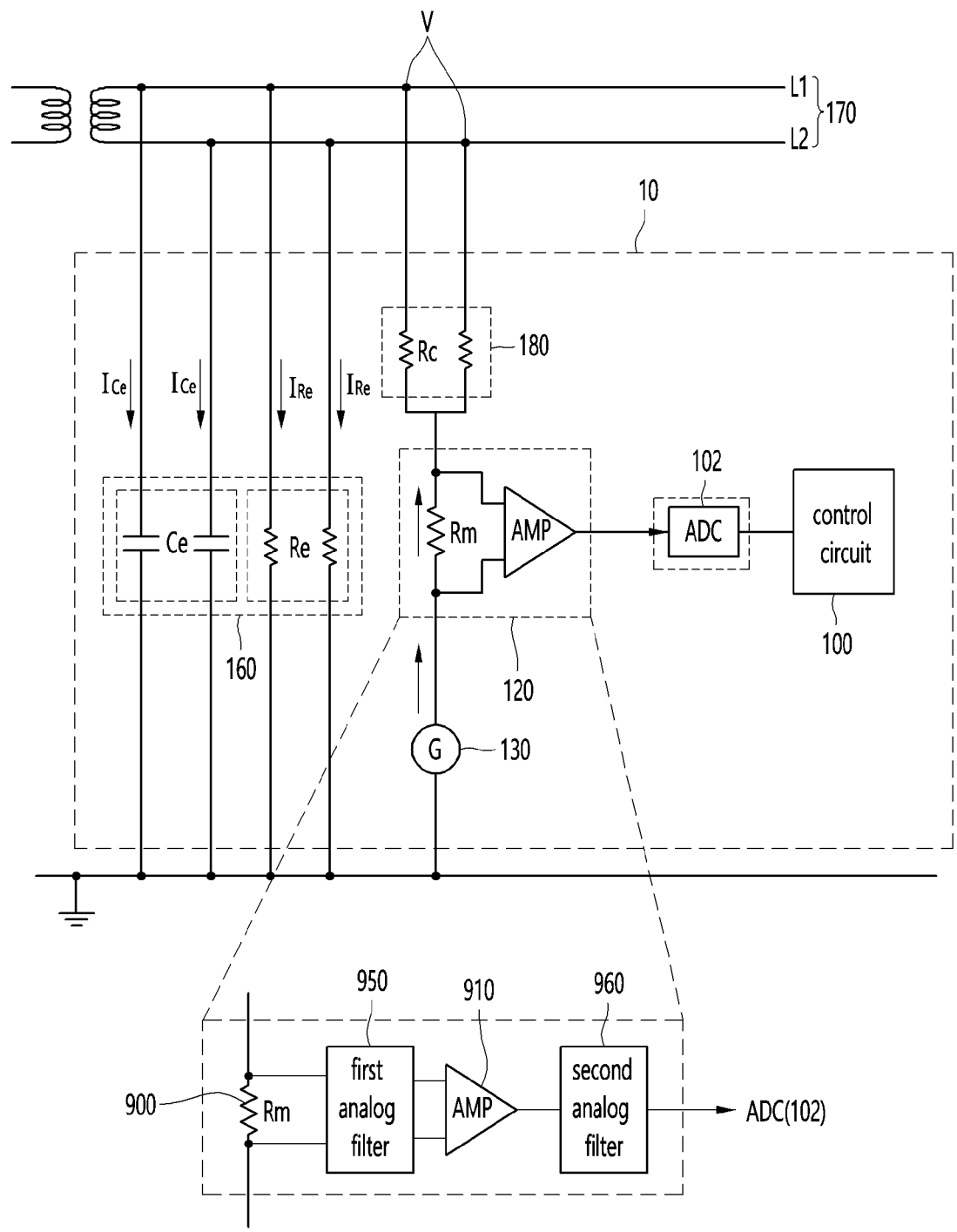

[Fig. 10]
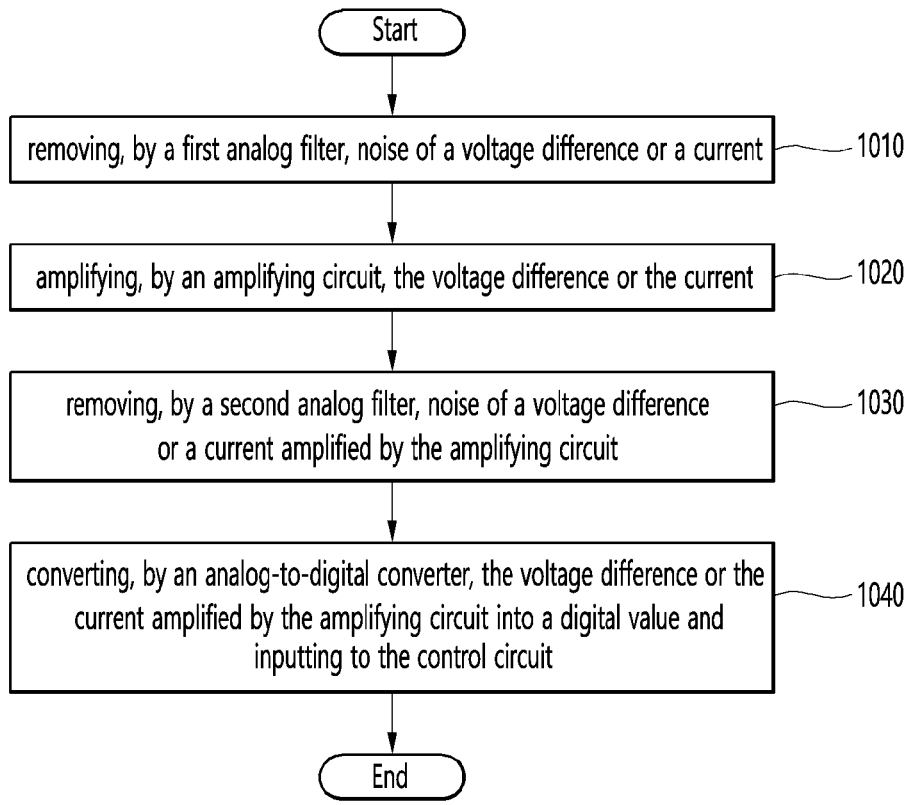

[Fig. 11]
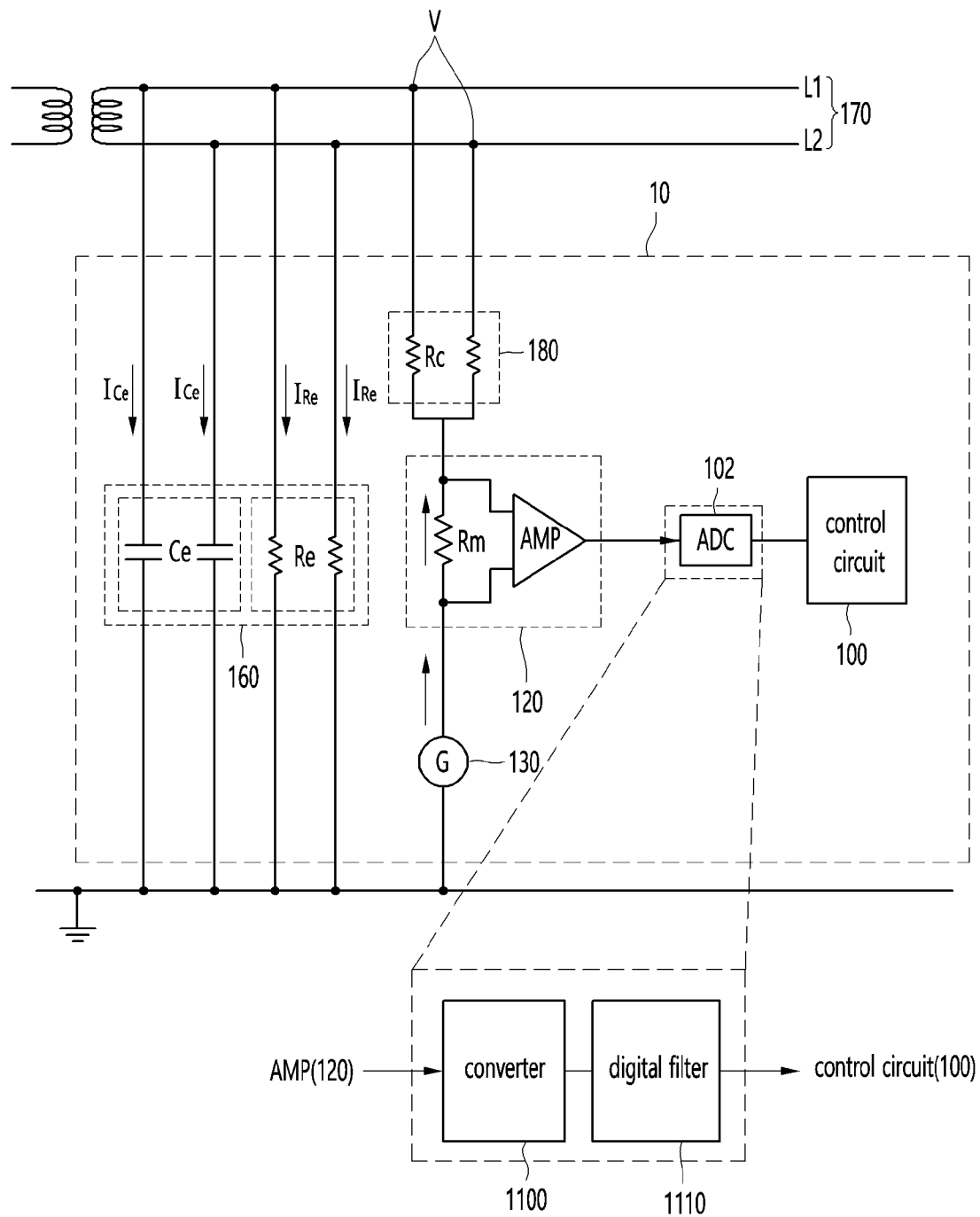

[Fig. 12]
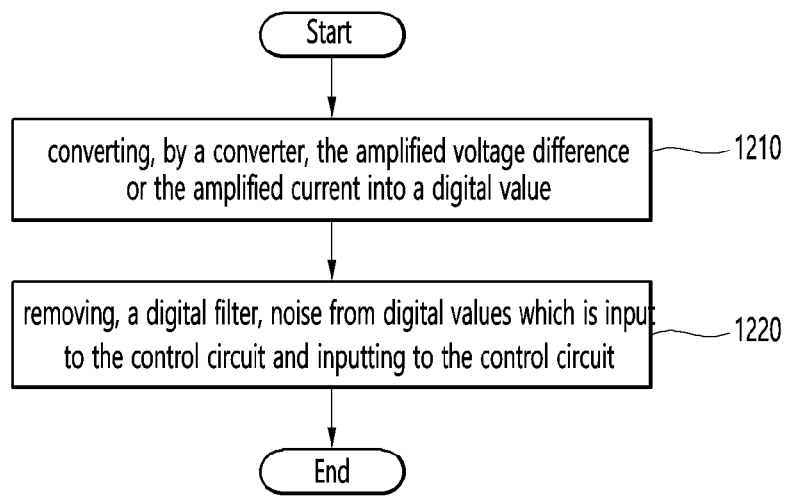

INSULATION MONITORING DEVICE USING TRIANGULAR WAVE AND METHOD FOR CONTROLLING THEREOF

RELATED APPLICATIONS

This application is a national phase application filed under 35 USC § 371 of PCT Application No. PCT/KR2020/012047 with an International filing date of Sep. 7, 2020, which claims priority to KR Patent Application 10-2020-0093990, filed Jul. 28, 2020. Each of these applications is herein incorporated by reference in its entirety for all purposes.

TECHNICAL FIELD

The present invention relates to an insulation monitoring device for preventing accidents by detecting a line-to-ground fault and power quality deterioration in a insulation terra (IT) power system and a method for controlling thereof.

BACKGROUND ART

The IT (Insulation Terra) grounding method is a grounding method in which neither of the power lines is grounded, but only through the enclosure of the load. The IT grounding method has the advantage of securing continuous operation of the system, as there is time to find the part of the system where the line-to-ground fault has occurred without stopping the operation of the system even when the line-to-ground fault occurs in any of the power lines.

However, since the system is capable of operate even when a line-to-ground fault occurs, it is necessary to continuously monitor the insulation state of the power line even when the system is in operation. Accordingly, the IEC (International Electro-technical Commission) 61557 regulation mandates the installation of an insulation monitoring device capable of monitoring the insulation state of power lines.

Accordingly, also in Korea, the criteria for the determination of the Electrical Equipment Technical Standard No. 2019-667 by the Ministry of Trade, Industry and Energy on Nov. 21, 2019 to ensure that the electrical storage devices using secondary batteries are equipped with appropriate protection and control devices such as IMD was announced.

Such an insulation monitoring device includes a signal generation circuit that is between a ground and a power line, forms a circuit between the power line and the ground through an insulation resistor and a capacitor formed between the power line and the ground, and injects a signal and a detection resistor for detecting a voltage. In addition, the control circuit measures and analyzes the voltage across the detection resistor to detect the voltage when the insulation state is normal, and calculates the magnitude of the insulation resistor based on the detected voltage, so that the insulation state of the power line can be monitored.

For example, the signal generation circuit may generate and inject a pulse signal into the circuit. In order to accurately calculate the magnitude of the insulation resistor, it is necessary to calculate the voltage in the normal state after inverting the polarity of the pulse signal. However, since the pulse signal is not continuous, if the polarity of the pulse signal is reversed, the voltage is temporarily unstable due to a surge phenomenon caused by the voltage difference of the inverted pulse signal. Therefore, there is a disadvantage in that the magnitude of the insulation resistor must be calculated after a certain period of time has elapsed and the voltage is stabilized again, and it is impossible to monitor the voltage value applied across the capacitor formed between the power line and the ground.

DISCLOSURE OF INVENTION

Solution to Problem

The present application is to solve the above-described problem, by placing an insulation resistor and a capacitor between the power line and the ground, and injecting a triangular wave signal having continuity to the insulation resistor and the capacitor, thereby providing an insulation monitoring device capable of preventing the surge phenomenon due to the voltage difference of the pulse signal and stably maintaining the voltage at both ends of the detection resistor.

In addition, when the value of the capacitor disposed between the power line and the ground cannot be monitored, if an accident occurs and the value of the capacitor increases abnormally, the value of the total impedance disposed between the power line and the ground decreases. Therefore, the power from the power line may be lost or a ripple may occur.

In order to solve the above-described problem, the present application provides a monitoring device that accurately monitors not only the insulation resistor but also the capacitance value of the capacitor by injecting a triangular wave signal having continuity into the insulation resistor and the capacitor.

An insulation monitoring device including an impedance formed between a power line and a ground of a system according to various embodiments of the present disclosure includes a signal generation circuit for applying a triangular wave signal to the power line through a signal measurement circuit, and the signal measurement circuit for measuring a voltage difference across the detection resistor of the signal measurement circuit or a current flowing through the detection resistor when the triangular wave signal is applied to the impedance, and a control circuit for obtaining an impedance value of the impedance based on at least one of the voltage difference and current value and monitoring the impedance value.

A method of controlling an apparatus including an impedance formed between a power line and a ground of a system according to various embodiments of the present disclosure includes, applying by a signal generation circuit a triangle wave signal to the power line through a signal measurement circuit, measuring by the signal measurement circuit a voltage drop across the detection resistor of the signal measurement circuit or a current flowing through the detection resistor, obtaining by the control circuit the impedance value of the impedance based on at least one of the voltage drop and the current value, and monitoring by the control circuit the impedance value.

Advantageous Effects of Invention

According to an exemplary embodiment of the present disclosure, the signal generation circuit of the insulation monitoring device has continuity and applies a triangular wave signal having linearity to the impedance in a specific section, such that the insulation monitoring device can provide stable insulation monitoring.

In addition, by injecting a triangular wave signal into the insulating capacitor, it is possible to monitor not only the insulation resistance but also the capacitance of the capacitor, thereby providing more accurate insulation monitoring.

BRIEF DESCRIPTION OF DRAWINGS

FIG. 1 is a block diagram illustrating an exemplary structure of an insulation monitoring device according to various embodiments of the present application.

FIG. 2 is a flowchart illustrating an operation of monitoring an impedance value in an insulation monitoring device according to an exemplary embodiment of the present application.

FIG. 3 depicts exemplary graphs for V, $I_{Re}$, and $I_{RC}$ in the insulation monitoring device of FIG. 1.

FIG. 4 is a block diagram showing an exemplary structure of a signal generation circuit according to an embodiment of the present application.

FIG. 5 is a flowchart illustrating an operation in which the signal generation circuit generates a triangle wave signal according to an embodiment of the present application.

FIG. 6 is a block diagram showing an exemplary structure of a signal source according to an embodiment of the present application.

FIG. 7 is an exemplary flowchart illustrating an operation of generating a signal in the form of a triangular wave by a signal source according to an exemplary embodiment of the present application.

FIG. 8 depicts exemplary graphs of the shape of a signal in each step in an operation in which a signal source generates a triangular wave shape signal according to an embodiment of the present application.

FIG. 9 is an exemplary block diagram of an internal configuration of a signal measurement circuit according to an embodiment of the present application.

FIG. 10 is a flowchart of an operation of a signal measurement circuit according to an embodiment of the present application.

FIG. 11 is an exemplary block diagram of an internal configuration of an analog-to-digital converter disposed between a signal measurement circuit and a control circuit according to an embodiment of the present application.

FIG. 12 is a flowchart illustrating an operation of an analog-to-digital converter disposed between a signal measurement circuit and a control circuit according to an embodiment of the present application.

MODE FOR THE INVENTION

It should be noted that the technical terms used in the specification are only used to describe specific embodiments, and are not intended to limit the present invention. In addition, the singular expression used in the present specification includes a plurality of expressions unless the context clearly indicates otherwise. In this specification, "consists of" or "includes" terms, such as, should not be construed as necessarily including all of the various components or steps described in the specification, and some components or some steps may not be included, or additional components or steps may be included, or it should be construed as more inclusive.

In addition, in describing the technology disclosed in the specification, if it is determined that a detailed description of a related known technology may obscure the gist of the technology disclosed in the present specification, the detailed description thereof will be omitted.

In describing each drawing, similar reference numerals are used for similar elements.

In addition, terms such as first and second may be used to describe various elements, but the elements should not be limited by the terms. These terms are used only for the purpose of distinguishing one component from another component.

Terms which are commonly used such as those defined dictionaries should be interpreted as having a meaning consistent with the meaning in the context of the related technology, and should not be interpreted as an ideal or excessively formal meaning unless explicitly defined in this application.

FIG. 1 is a block diagram illustrating an exemplary structure of an insulation monitoring device according to various embodiments of the present application.

Referring to FIG. 1, an insulation monitoring device (10) according to various embodiments of the present disclosure includes coupler resistors (Rc, 180) connected to the power lines of the system (hereinafter, power lines (170), a signal generation circuit (130) that applies a triangular wave signal to the power line (170) through the coupler resistors (180) and a signal measurement circuit (120), an impedance (160) which is formed between the power line (170) and the ground, and consists of an insulation resistor (Re) and a capacitor (Ce), the signal measurement circuit (120) including the detection resistor (Rm), and the control circuit (100) which controls other components, and calculates and monitors the value of the impedance (160) based on at least one of the voltage difference across the detection resistor and the current flowing through the detection resistor. Although not shown in FIG. 1, the insulation monitoring device (10) includes a memory (not shown) in which data input to the control circuit (100) and/or various data output from the control circuit (100) are stored, and a control Controlled by circuit (100) and may include a display (not shown) configured to display the state of impedance (160).

FIG. 1 illustrates an example in which the power line (170) of the system is single-phase, but the power line (170) of the system may be formed in a multi-phase. For example, the power line (170) of the system may be three-phase (R, S, T). The coupler resistor (180) may be configured of resistors formed on the multi-phase power lines, for example, R-line, S-line, and T-line in the case of three-phase.

The components shown in FIG. 1 are not essential in implementing the insulation monitoring device (10), so the insulation monitoring device (10) described herein may include more or less components than the above-described components.

FIG. 2 is a flowchart illustrating an operation of monitoring an impedance value in an insulation monitoring device according to an exemplary embodiment of the present application. FIG. 3 depicts exemplary graphs for V, $I_{Re}$, and $I_{RC}$ in the insulation monitoring device of FIG. 1.

In step 210, the signal generation circuit (130) may apply a triangular wave signal to the power lines (170) through the signal measurement circuit (120). The triangular wave signal may refer to a signal in which a triangle-shaped waveform is periodically repeated. For example, the triangle wave signal may have an amplitude of −50V to +50V. The triangular wave signal generated by the signal generation circuit (130) may be applied to the power lines (170) through the signal measurement circuit (120) and the coupler resistor (180), and the impedance 160 disposed between the power line (170) and the ground.

In step 220, when the triangular wave signal is applied to the impedance (160), the signal measurement circuit (120) may measure the voltage difference across the detection resistor (Rm) of the signal measurement circuit (120) or the current flowing through the detection resistor (Rm). For example, the signal measurement circuit (120) may measure the current flowing through the detection resistor (Rm) using a transformer or the like. Applying the trianguar wave signal to the impedance (160) may mean that the signal measurement circuit (120), the signal generation circuit (130), the coupler resistor (180), the power line (170), and the impedance (160) form a closed circuit. When the closed circuit is formed by the above-described components of the insulation monitoring device (10), the voltage difference between the signal measurement circuit and/or a current flowing through the signal measurement circuit (for example, the voltage difference between the both ends of the detection resistor (Rm) and/or the current flowing through the detection resistor (Rm)) may be determined, and the signal measurement circuit (120) may measure the voltage difference and/or current. The voltage difference and/or the current measured by the signal measurement circuit (120) may be input to the control circuit (100).

In step 230, the control circuit (100) may obtain an impedance value of the impedance (160) based on at least one of the voltage difference and the current, and monitor the impedance value. The control circuit (100) acquires the value of the voltage difference across the signal measurement circuit or the detection resistor and the current flowing through the detection resistor, and calculates the values of the insulation resistor (Re) and the capacitor (Ce) included in the impedance (160) using at least one of the obtained voltage difference and the current value. The control circuit 100 presets respective values for the case where the values of the insulation resistor (Re) and the capacitor (Ce) are in the normal range, and monitors whether the calculated insulation resistor (Re) and the capacitor (Ce) are in the normal range. For the values of the insulation resistor (Re) and the capacitor (Ce) being in the normal range may mean a state in which a line-to-ground fault does not occur and the closed circuit operates normally.

According to an embodiment, the control circuit (100) calculates the voltage value (V) of the power line (170), the insulation resistor current ($I_{Re}$) and the capacitor current ($I_{Ce}$) respectively flowing through the insulation resistor (Re) and the capacitor (Ce) based on the voltage difference between the detection resistor. Each graph may be a graph shown in FIG. 3. However, the graphs of FIG. 3 are exemplary, and ranges of current and voltage values may be variously set. As described above, the voltage value (V), the insulation resistor current ($I_{Re}$), and the capacitor current ($I_{Ce}$) of the power line (170) may be determined by the total impedance value of the closed circuit. For example, the voltage value (V) of the power line (170) may have a voltage value in which a voltage is dropped from the triangular wave signal of the signal generation circuit (130) through the detection resistor (Rm) and the coupler resistor (180). Accordingly, the control circuit (100) may calculate a voltage value applied to the insulation resistor (Re) and the capacitor (Ce) using the voltage difference across the detection resistor (Rm) and the voltage difference across the coupler resistor (180), and obtain the current value of the current flowing through each of the insulation resistor (Re) and the capacitor (Ce) based on the calculated voltage value. In addition, the control circuit (100) may obtain values of the insulation resistor (Re) and the capacitor (Ce) based on the calculated voltage value, the insulation resistor (Re), and the current values of the current flowing through each of the insulation resistor (Re) and the capacitor (Ce).

The current applied to each of the insulation resistor (Re) and the capacitor (Ce) is the same as the current flowing through the detection resistor Rm, and can be expressed as follows.

$$I_{Ce} + I_{Re} = I_{inj} = \frac{v_{Rm}}{R_m} \quad \text{[Math. 1]}$$

In addition, the value of the insulation resistor may be expressed as a ratio of the difference in the voltage difference across the insulation resistor between the specific times $t_1$ and $t_2$ in FIG. 3 and the difference in the current flowing through the insulation resistor, for example, can be expressed as follows.

$$Re = \frac{V(t1) - V(t2)}{Iinj(t1) - Iinj(t2)} \quad \text{[Math. 2]}$$

In addition, the value of the capacitor can be expressed as follows based on the above two equations.

$$Ce = \frac{Iinj(t2) - V(t2)/Re}{dV(t2)/dt} \quad \text{[Math. 3]}$$

According to one embodiment, when the current value flowing through the capacitor (Ce) is maintained at a constant value for a predetermined period of time, the control circuit (100) may obtain and monitor the value of the insulation resistor (Re) and the capacitor (Ce). The predetermined time can be arbitrarily set so that the values of the insulation resistor and the capacitor can be accurately measured. The current flowing through the capacitor (Ce) may change similialy as the capacitor current ($I_{Ce}$) of FIG. 3 due to a periodic change in the slope of the triangular wave signal. Since the triangular wave signal has linearity in the form of a linear function in all sections except for the inflection point, the capacitor current ($I_{Ce}$) may have a constant value in periods except for the section around the inflection point. Since the capacitor current ($I_{Ce}$) can have accurate results only when the insulation resistor and the capacitor are measured in a state where the capacitor current ($I_{Ce}$) is stable, the control circuit (100) may calculate the value of the insulation resistor and the capacitor if the capacitor current ($I_{Ce}$) is maintained constant for a predetermined time (for example, the interval period p between $t_1$ and $t_2$ in FIG. 3). In the above, it has been described that the value of the insulation resistor and the capacitor are calculated using the voltage difference across the detection resistor. However, it is obvious for a person skilled in the art that the signal measurement circuit calculates the insulation resistor and capacitor using the current flowing through the detection resistor measured using the transformer.

According to an embodiment, the insulation monitoring device (10) may include a display (not shown) which displays various data according to the operation of the insulation monitoring device (10). For example, the display may display impedance values, monitoring results, and the like. For example, since the insulation monitoring device (10) continuously calculates the magnitude of the insulation resistor, the display displays the magnitude of the impedance over time in the form of a graph, thereby displaying the magnitude change of the impedance and the monitoring result in real time. In addition, the insulation monitoring device (10) may include at least one input unit (not shown) for receiving user input. For example, the input unit may be configured to include at least one hardware key or a touch key. Alternatively, when the display is implemented in the form of a touch screen, the display may be used as the input unit.

According to an embodiment, the insulation monitoring device (10) may further include a communication module (not shown) that performs wireless or wired communication with a preset user terminal. The communication unit may notify the user terminal of information related to the occurrence of a line-to-ground fault in the power line (170). Here, the line-to-ground fault of the power line (170) may be detected by the control circuit (100) of the insulation monitoring device (10) and may be detected according to the calculated impedance value.

FIG. 4 is a block diagram showing an exemplary structure of a signal generation circuit according to an embodiment of the present application. FIG. 5 is a flowchart illustrating an operation in which the signal generation circuit generates a triangle wave signal according to an embodiment of the present application.

Referring to FIG. 4, the signal generation circuit (120) of the present application may include a signal source (410), an OP Amplifier (OP Amp, 420), a booster circuit (430), and a feedback circuit (440). In step 510, the signal source (410) may generate a signal in the form of a triangle wave, which is a basis of the triangle wave signal output from the signal generation circuit (120). For example, a signal output from the signal source (410) may have an amplitude of more than 0V and equal or less than 3.3V. In step 520, the OP Amp (420) may amplify the signal from the signal source (410) such that the amplitude of the signal has a first range. For example, the first range may be set such that the signal from the signal source (410) has a value greater than −3.85V and equal or less than 2.93V. In step 530, the booster circuit (430) may amplify the signal from the OP Amp (420) such that the amplitude of the signal from the OP Amp (420) has a second range greater than the first range. For example, the second range may be set such that the signal from the booster circuit 430 has a value of −32V to 32V, specifically, a value of more than −50V and equal or less than 50V. In step 540, the feedback circuit (440) may feedback the output of the booster circuit (430) so that the output of the signal generation circuit (120) has a predetermined gain. The feedback circuit (440) may feedback the output of the signal generation circuit (120) to have an amplitude greater than or equal to a specific value. For example, the feedback circuit (440) may feedback the output of the signal generation circuit (120) based on values of the resistors disposed in the feedback circuit (440). The limitations of the above-described range are exemplary only, and may be variously set, and the above-described examples do not limit the scope of the present application.

FIG. 6 is a block diagram showing an exemplary structure of a signal source according to an embodiment of the present application. FIG. 7 is an exemplary flowchart illustrating an operation of generating a signal in the form of a triangular wave by a signal source according to an exemplary embodiment of the present application. FIG. 8 depicts exemplary graphs of the shape of a signal in each step in an operation in which a signal source generates a triangular wave shape signal according to an embodiment of the present application.

Referring to FIG. 6, the signal source (410) according to an embodiment of the present application may include a phase accumulator (610), a phase-amplitude converter (620), a digital-analog converter (630), and a filter (640). The phase accumulator (610), the phase-amplitude converter (620), and the digital-analog converter (630) may be updated for every clock ($f_{cik}$). Referring to FIG. 7, in step 710, the phase accumulator (610) receives a phase value as an input for each clock ($f_{cik}$) and accumulates the received phase value. As the phase accumulator (610) receives a phase value as an input for each clock ($f_{ak}$), the accumulated phase value may increase or decrease. For example, the phase accumulator (610) increases or decreases the accumulated phase value as in the graph of the output of the phase accumulator of FIG. 8 according to the input phase value, and the output of the phase accumulator (610) may have a form of the triangular wave. In step 720, the phase-amplitude converter (620) may convert the accumulated phase value into the amplitude value. For example, the accumulated phase value may be converted to a corresponding amplitude value, and in this case, the amplitude value may be a digital value. As the amplitude value has a digital value, as shown in the phase-amplitude converter (620) of FIG. 8, the phase-amplitude converter (620) may output a digital amplitude value for every clock. In step 730, the analog converter (630) may convert the amplitude value into an analog value. In step 740, the filter (640) may flatten the converted analog value. The output values of the analog converter (630) and the filter (640) may have output similar as a graph of the output of the analog converter (630) of FIG. 8 and a graph of the output of the filter (640) respectively. After the flattening by the filter (640), the output of the signal source (410) may be a triangular wave form having linearity.

FIG. 9 is an exemplary block diagram of an internal configuration of a signal measurement circuit according to an embodiment of the present application. FIG. 10 is a flowchart of an operation of a signal measurement circuit according to an embodiment of the present application.

Referring to FIG. 9, the insulation monitoring device (10) according to various embodiments of the present disclosure includes coupler resistors (Rc, 180) connected to the power lines of the system (170), a signal generation circuit (130) that applies a triangular wave signal to the power line (170) through the coupler resistors (180) and a signal measurement circuit (120), an impedance (160) which is formed between the power line (170) and the ground, and consists of an insulation resistor (Re) and a capacitor (Ce), the signal measurement circuit (120) including the detection resistor (Rm), and the control circuit (100) which controls other components, and calculates and monitors the value of the impedance (160) based on at least one of the voltage difference across the detection resistor and the current flowing through the detection resistor. Since the above-described configurations have been described in detail in FIGS. 1 to 8, detailed descriptions are omitted.

The signal measurement circuit (120) according to an embodiment of the present application may include a detection resistor (900), a first analog filter (950), an amplifying circuit (910), and a second analog filter (960), and the insulation monitoring device (10) may further include an analog-to-digital converter (ADC) (102). In step 1010, the first analog filter (950) may remove noise of a voltage difference applied to both ends of the detection resistor (900) or a current flowing through the detection resistor (900). The first analog filter (950) may be disposed between the detection resistor (900) and the amplifying circuit (910). In step 1020, the amplifying circuit (910) may amplify a voltage difference across the detection resistor (900) or a current flowing through the detection resistor (900). In operation 1030, the second analog filter (960) may remove noise of a voltage difference or current amplified by the amplifying circuit (910). The second analog filter (960) may be connected between the amplifying circuit (910) and the ADC (102). In step 1040, the ADC (102) may convert the voltage difference or current amplified by the amplifying circuit (910) into a digital value and input the result to the control circuit. The first analog filter (950) and the second analog filter (960) may be alternatively disposed or the both may be disposed. When both the first analog filter (950) and the second analog filter (960) are disposed, when fine noise that is not removed from the first analog filter (950) is amplified through the amplifying circuit (910), by removing through the second analog filter (960), a more accurate measured voltage or current can be input to ADC (102). For example, the first analog filter (950) and the second analog filter (960) may be hardware filters, or filters which have different passband, cutoff band, roll off, and phase delay characteristics.

FIG. 11 is an exemplary block diagram of an internal configuration of an analog-to-digital converter disposed between a signal measurement circuit and a control circuit according to an embodiment of the present application. FIG. 12 is a flowchart illustrating an operation of an analog-to-digital converter disposed between a signal measurement circuit and a control circuit according to an embodiment of the present application.

Referring to FIG. 11, the insulation monitoring device (10) according to various embodiments of the present disclosure includes coupler resistors (Rc, 180) connected to the power lines of the system (170), a signal generation circuit (130) that applies a triangular wave signal to the power line 170 through the coupler resistors (180) and a signal measurement circuit (120), an impedance (160) which is formed between the power line (170) and the ground, and consists of an insulation resistor (Re) and a capacitor (Ce), the signal measurement circuit (120) including the detection resistor (Rm), and the control circuit (100) which controls other components, and calculates and monitors the value of the impedance (160) based on at least one of the voltage difference across the detection resistor and the current flowing through the detection resistor. Since the above-described configurations have been described in detail in FIGS. 1 to 8, detailed descriptions are omitted.

According to an embodiment, the insulation monitoring device (10) may include an analog-to-digital converter (ADC) (102) disposed between the signal measurement circuit (120) and the control circuit (100). The ADC (102) is a filter for removing noise existing inside the insulation monitoring device (10) and may include a conversion circuit (1100) and a digital filter (1110). In operation 1210, the conversion circuit (1100) may convert the amplified voltage difference or current into a digital value. In operation 1220, noise of digital values input to the control circuit may be removed. The digital filter (1110) may be disposed between the conversion circuit (1100) and the control circuit (100). The digital filter (1110) removes noise from the voltage values or current values input to the control unit (100), so that noise of the inside of the insulation monitoring device (10) can be removed. The digital filter (1110) may be a software filter, and properties of the filter such as a cutoff frequency and an order may be changed according to a characteristic of a noise component existing in the insulation monitoring device (10).

According to various embodiment of the present application, an insulation monitoring device comprising an impedance formed between a power line and a ground of a system may comprise a signal generation circuit for applying a triangular wave signal to the power line through a signal measurement circuit, the signal measurement circuit for measuring a voltage difference across the detection resistor of the signal measurement circuit or a current flowing through the detection resistor when the triangular wave signal is applied to the impedance, a control circuit for obtaining an impedance value of the impedance based on at least one of the voltage difference and the current, and monitoring the impedance value.

According to an embodiment of the present application, wherein the signal generation circuit comprises a signal source for generating a signal in the form of a triangle wave, an OP Amp for amplifying the signal from the signal source so that the amplitude of the signal has a first range, a booster circuit for amplifying the signal from the OP Amp so that the amplitude of the signal from the OP Amp has a second range greater than the first range, and a feedback circuit for feeding back the output of the booster circuit so that the output of the signal generation circuit has a predetermined gain.

According to an embodiment of the present application, wherein the signal source comprises, a phase accumulator for receiving a phase value for each clock and accumulating the received phase value, a phase-amplitude converter converting the accumulated phase value into an amplitude value, a digital to analog converter converting the amplitude value into an analog value, and a filter for flattening the converted analog value.

According to an embodiment of the present application, wherein the impedance includes an insulation resistor and a capacitor, wherein the control circuit obtains a current value flowing through each of the insulation resistor and the capacitor based on at least one of the voltage difference or the current, and when the current value flowing through the capacitor is maintained at a constant value for a predetermined time, obtains values of the insulation resistor and the capacitor to monitor the insulation resistor and the values of the capacitor.

According to an embodiment of the present application, wherein the monitoring device further comprises a display, wherein the control circuit displays the monitoring result through the display.

According to an embodiment of the present application, wherein the signal measurement circuit further comprises, an amplifying circuit for amplifying the voltage difference across the detection resistor or the current, an analog-digital converter (ADC) for converting the voltage difference or the current amplified by the amplifying circuit into a digital value and inputting it to the control circuit, and at least one of a first analog filter formed between the detection resistor and the amplifying circuit, for removing noise of the voltage difference or the current applied to both ends of the detection resistor, and a second analog filter, connected between the amplifying circuit and the ADC, for removing noise of the amplified voltage difference or current amplified in the amplifying circuit.

According to an embodiment of the present application, wherein the ADC further comprises, a converter for converting the amplified voltage difference into a digital value, and a digital filter, formed between the conversion circuit and the control circuit, for removing noise for digital values input to the control circuit.

According to various embodiments of the present application, a method of controlling a device comprising an impedance formed between a power line and ground of a system comprises, applying, by a signal generation circuit, a triangular wave signal to the power line through a signal measurement circuit, when the triangular wave signal is applied to the impedance, measuring, by the signal measurement circuit, a voltage difference across the detection resistor of the signal measurement circuit or a current flowing through the detection resistor, obtaining, by a control circuit, an impedance value of the impedance based on at least one of the voltage difference and the current, and monitoring the impedance value.

According to an embodiment of the present application, wherein the step of applying the triangle wave signal comprises, generating a signal in the form of a triangular wave by the signal source, amplifying, by an op amp, a signal from the signal source so that the amplitude of the signal has a first range, amplifying, by a booster circuit, the signal from the op amp so that the amplitude of the signal from the op amp has a second range that is greater than the first range, and feeding back, by a feedback circuit, the output of the booster circuit such that the output of the signal generation circuit has a predetermined gain.

According to an embodiment of the present application, further comprising, generating the signal in the triangular wave form by the signal source, receiving a phase value for each clock by a phase accumulator and accumulating the received phase value, converting, by a phase-amplitude converter, the accumulated phase value into an amplitude value, converting, by a digital-to-analog converter, the amplitude value to an analog value, flattening, by a filter, the converted analog value.

According to an embodiment of the present application, wherein the impedance includes an insulation resistor and a capacitor, wherein the method further comprising, obtaining, by the control circuit, a current value flowing through each of the insulation resistor and the capacitor based on at least one of the voltage difference and the current, and when the current value flowing through the capacitor by the control circuit is maintained at a constant value for a predetermined time, obtaining a value of the insulation resistor and the capacitor to monitor the value of the insulation resistor and the capacitor.

According to an embodiment of the present application, further comprising displaying, by the control circuit, to display the monitoring result through a display.

According to an embodiment of the present application, further comprising, removing, by the first analog filter, noise of a voltage applied across the detection resistor or a current flowing through the detection resistor, wherein the first analog filter is formed between the detection resistor and the amplifying circuit, amplifying, by an amplifying circuit, the voltage difference or the current across the detection resistor, removing, by the second analog filter, a voltage difference amplified by the amplifying circuit or noise of the current, wherein the second analog filter is connected between the amplifying circuit and an analog-to-digital converter (ADC), and converting, by the analog-to-digital converter, the voltage difference or the current amplified by the amplifying circuit into a digital value and inputting it to the control circuit.

According to an embodiment of the present application, further comprising, converting, by a converter, the amplified voltage difference or the current into a digital value, and removing, a digital filter, noise from digital values input to the control circuit and inputting the noise to the control circuit.

The invention claimed is:

1. An insulation monitoring device comprising:
    an impedance formed between a power line and a ground of a system, the impedance comprising:
    a signal generation circuit for applying a triangular wave signal to the power line through a signal measurement circuit;
    the signal measurement circuit for measuring a voltage difference across a detection resistor of the signal measurement circuit or a current flowing through the detection resistor when the triangular wave signal is applied to the impedance;
    a control circuit configured to obtain an impedance value of the impedance based on at least one of the voltage difference and the current and to monitor the impedance value
    wherein the impedance includes an insulation resistor and a capacitor, and
    wherein the control circuit is further configured to:
        obtain a voltage difference across both ends of the insulation resistor based on a voltage difference across both ends of the detection resistor;
        obtain the insulation resistor value by obtaining the ratio of the difference in voltage across the insulation resistor between the first time point t1 and the second time point t2 and the difference in current flowing through the detection resistor;
        obtain the capacitor value based on the insulation resistor value at the second time point t2.

2. The insulation monitoring device according to claim 1, wherein the signal generation circuit comprises:
    a signal source for generating a signal in the form of a triangle wave;
    an OP Amp for amplifying the signal from the signal source such that the amplitude of the signal has a first range;
    a booster circuit for amplifying the signal from the OP Amp such that the amplitude of the signal from the OP Amp has a second range greater than the first range; and
    a feedback circuit for feeding back the output of the booster circuit such that the output of the signal generation circuit has a predetermined gain.

3. The insulation monitoring device according to claim 2, wherein the signal source comprises:
    a phase accumulator for receiving a phase value for each clock and accumulating the received phase value;
    a phase-amplitude converter for converting the accumulated phase value into an amplitude value;
    a digital-to-analog converter for converting the amplitude value into an analog value; and
    a filter for flattening the converted analog value.

4. The insulation monitoring device according to claim 1, wherein the control circuit obtains a current value flowing through each of the insulation resistor and the capacitor based on at least one of the voltage difference or the current, and obtains values of the insulation resistor and the capacitor to monitor the insulation resistor and the values of the capacitor when the current value flowing through the capacitor is maintained at a constant value for a predetermined time.

5. The insulation monitoring device according to claim 1, wherein the monitoring device further comprises a display, and wherein the control circuit displays the monitoring result through the display.

6. The insulation monitoring device according to claim 1, wherein the signal measurement circuit further comprises:
    an amplifying circuit for amplifying the voltage difference across the detection resistor or the current;

an analog-to-digital converter (ADC) for converting the voltage difference or the current amplified by the amplifying circuit into a digital value and inputting it to the control circuit; and at least one of a first analog filter connected between the detection resistor and the amplifying circuit, for removing noise of the voltage difference or the current applied to both ends of the detection resistor, and a second analog filter, connected between the amplifying circuit and the ADC, for removing noise of the amplified voltage difference or current amplified in the amplifying circuit.

7. The insulation monitoring device according to claim 6, wherein the ADC further comprises:

a converter for converting the amplified voltage difference into a digital value; and a digital filter, formed between the conversion circuit and the control circuit, for removing noise for digital values input to the control circuit.

8. A method of controlling a device comprising an impedance formed between a power line and ground of a system the method comprising:

applying, by a signal generation circuit, a triangular wave signal to the power line through a signal measurement circuit;

when the triangular wave signal is applied to the impedance, measuring, by the signal measurement circuit, a voltage difference across the detection resistor of the signal measurement circuit or a current flowing through the detection resistor;

obtaining, by a control circuit, an impedance value of the impedance based on at least one of the voltage difference and the current; and monitoring, by a control circuit, the impedance value, wherein the impedance includes an insulation resistor and a capacitor, and wherein the monitoring by a control circuit, the impedance value comprises:

obtaining a voltage difference across both ends of the insulation resistor based on a voltage difference across both ends of the detection resistor;

obtaining the insulation resistor value by obtaining the ratio of the difference in voltage across the insulation resistor between the first time point t1 and the second time point t2 and the difference in current flowing through the detection resistor;

obtaining the capacitor value based on the insulation resistor value at the second time point t2.

9. The method according to claim 8, wherein applying the triangle wave signal comprises:

generating, by the signal source, a signal in the form of a triangular wave;

amplifying, by an OP Amp, the signal from the signal source such that the amplitude of the signal has a first range;

amplifying, by a booster circuit, the signal from the op amp such that the amplitude of the signal from the op amp has a second range that is greater than the first range; and feeding back, by a feedback circuit, the output of the booster circuit such that the output of the signal generation circuit has a predetermined gain.

10. The method according to claim 9, wherein generating the signal in the triangular wave form by the signal source comprises:

receiving, by a phase accumulator, a phase value for each clock and accumulating the received phase value;

converting, by a phase-amplitude converter, the accumulated phase value into an amplitude value;

converting, by a digital-to-analog converter, the amplitude value to an analog value; and flattening, by a filter, the converted analog value.

11. The method according to claim 8, wherein the impedance includes an insulation resistor and a capacitor and wherein the method further comprises:

obtaining, by the control circuit, a current value flowing through each of the insulation resistor and the capacitor based on at least one of the voltage difference and the current; and when the current value flowing through the capacitor by the control circuit is maintained at a constant value for a predetermined time, obtaining, by the control circuit, a value of the insulation resistor and the capacitor to monitor the value of the insulation resistor and the capacitor.

12. The method according to claim 8, further comprising displaying, by the control circuit, the monitoring result through a display.

13. The method according to claim 8, the method further comprising:

removing, by a first analog filter, noise of a voltage applied across the detection resistor or a current flowing through the detection resistor, wherein the first analog filter is formed between the detection resistor and the amplifying circuit;

amplifying, by an amplifying circuit, the voltage difference or the current across the detection resistor;

removing, by a second analog filter, a voltage difference amplified by the amplifying circuit or noise of the current, wherein the second analog filter is connected between the amplifying circuit and an analog-to-digital converter (ADC); and converting, by an analog-to-digital converter, the voltage difference or the current amplified by the amplifying circuit into a digital value and inputting it to the control circuit.

14. The method according to claim 13, the method further comprising:

converting, by a converter, the amplified voltage difference or the current into a digital value; and removing, by a digital filter, noise from digital values input to the control circuit and inputting the noise to the control circuit.

* * * * *